(12) United States Patent
Boyle et al.

(10) Patent No.: US 6,652,326 B2
(45) Date of Patent: Nov. 25, 2003

(54) CONTACT APPARATUS PARTICULARLY USEFUL WITH TEST EQUIPMENT

(75) Inventors: Stephen A. Boyle, Attleboro, MA (US); John C. Bergeron, Attleboro, MA (US)

(73) Assignee: Rika Electronics International, Inc., Attleboro, MA (US)

( * ) Notice: Subject to any disclaimer, the term of this patent is extended or adjusted under 35 U.S.C. 154(b) by 0 days.

(21) Appl. No.: 09/903,206

(22) Filed: Jul. 11, 2001

(65) Prior Publication Data

US 2002/0013085 A1 Jan. 31, 2002

Related U.S. Application Data

(60) Provisional application No. 60/217,837, filed on Jul. 13, 2000.

(51) Int. Cl.$^7$ ............................................... H01R 13/24
(52) U.S. Cl. ........................................ 439/700; 439/66
(58) Field of Search ............................. 439/482, 700, 439/824, 66; 324/754, 755, 757, 761, 762

(56) References Cited

U.S. PATENT DOCUMENTS

| | | | |
|---|---|---|---|
| 3,416,125 A | | 12/1968 | Theve |
| 5,157,325 A | * | 10/1992 | Murphy ........................ 439/66 |
| 5,175,493 A | | 12/1992 | Langgard |
| 5,936,421 A | | 8/1999 | Stowers et al. |
| 6,053,777 A | | 4/2000 | Boyle |
| 6,275,054 B1 | | 8/2001 | Boyle |

* cited by examiner

*Primary Examiner*—Renee Luebke
*Assistant Examiner*—Felix D. Figueroa
(74) *Attorney, Agent, or Firm*—John A. Haug

(57) ABSTRACT

A double-ended, coaxial contact assembly has a center probe rod (12) mounted in the bore of a dielectric center spacer bushing (16) and mounts a probe contact assembly on each end of the center probe rod. The center probe rod is received in a ground sleeve (19) with the probe contact assemblies maintained in coaxial relationship with the ground sleeve by a dielectric outer spacer bushing (17). In certain embodiments a movable ground plunger (18g,22) is slidably received in each end of the ground sleeves and biased outwardly by respective ground plunger coil springs (25). In one such embodiment the center spacer bushing (16') is provided with an axially extending sleeve disposed between the respective probe contact assembly and the ground sleeve.

12 Claims, 5 Drawing Sheets

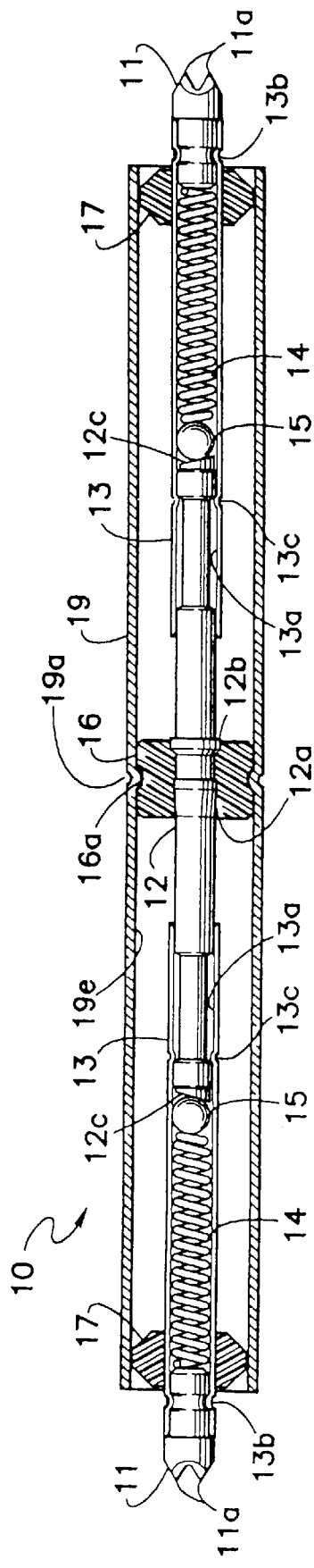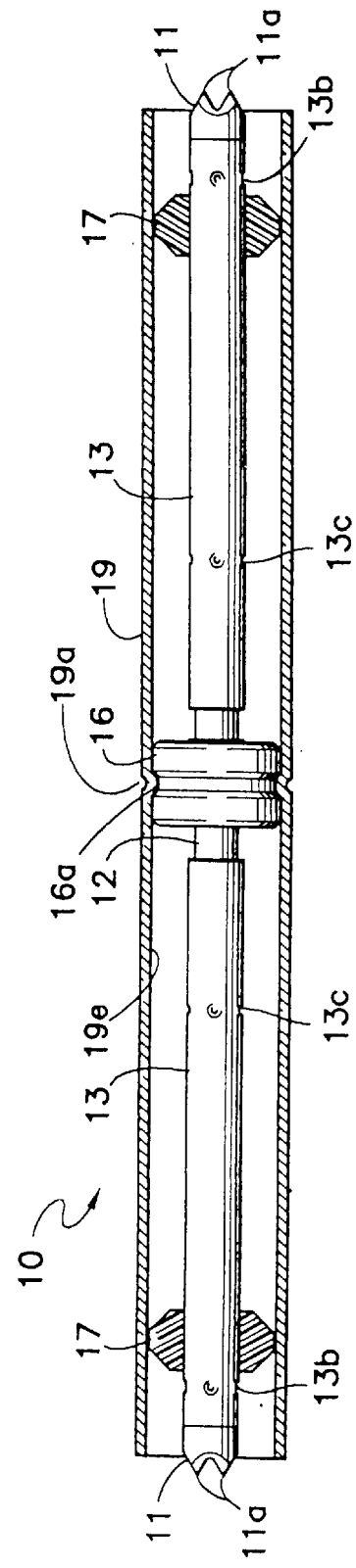

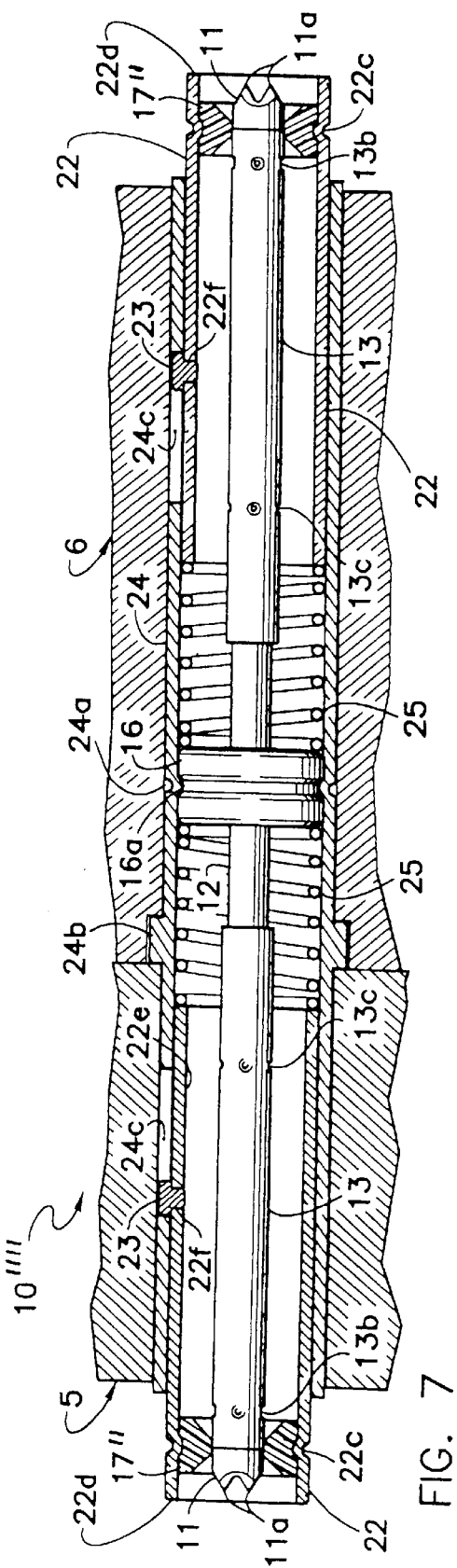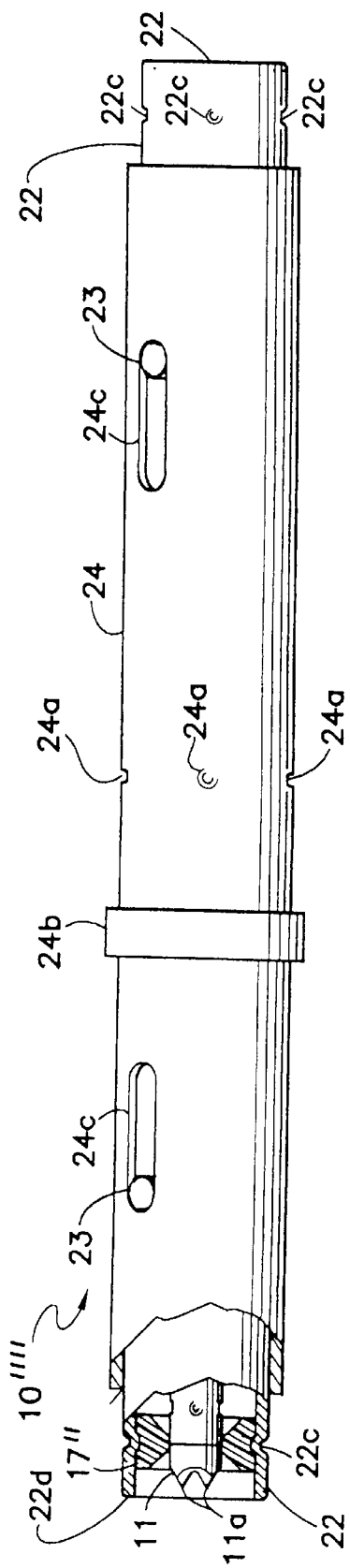
FIG. 7
FIG. 8

CONTACT APPARATUS PARTICULARLY USEFUL WITH TEST EQUIPMENT

RELATED APPLICATIONS

Priority is claimed on Provisional Application 60/217,837, filed Jul. 13, 2000.

FIELD OF THE INVENTION

This invention relates generally to electrical contact assemblies and more particularly to such assemblies used with test equipment for testing printed circuit boards and other electrical apparatus.

BACKGROUND OF THE INVENTION

It is conventional to use spring biased contact assemblies, or probes, in testing printed circuit boards and other electrical apparatus for electrical continuity and the like. Typically, contact probes, generally comprising a center signal contact and an outer shield or ground contact, are mounted in a support and brought into relative movement with a device to be tested, such as a circuit board. Upon engagement with the test sites, relative movement is continued for a selected distance, e.g., 0.090 inch is a conventional distance used in the industry, to ensure optimum contact engagement. Tests are performed by sending electrical signals through the test sites to check for electrical continuity and the like.

In carrying out testing using such contact assemblies, it is important to minimize signal mis-timing, delay and degradation. This is especially true when the contact assemblies are used with high speed apparatus where a delay in digital signal propagation can result in false readings.

Such contact assemblies have moving parts and inherently have a degree of mismatch within the manufacturing tolerances and materials employed. Any mismatches which do occur are directly related to the length of the contact assemblies so that the longer the assembly, the greater the mismatch.

It is known to use double ended coaxial contacts as shown in U.S. Pat. No. 3,416,125 to Theve; U.S. Pat. No. 5,175,493 to Langgard; U.S. Pat. No. 5,936,421 to Stowers et al. and U.S. Pat. No. 6,053,777 to Boyle. However, each of the above contact assemblies has one or more limitations. In the Theve and Stowers et al. patents a common spring is used to provide contact force for the inner contacts and another common spring is used to provide contact force for the outer contacts with no means provided for independent selection of the force for each contact. In the Langgard patent the double ended probe assembly includes two probes in back-to-back relationship but separated from one another in a barrel requiring conductive epoxy or the like for filling in the void between the probes to maintain conductivity thereby introducing potential yield problems as well as possible adverse affects on signal integrity. In the patent to Boyle, a contact system is attached to opposite ends of a coaxial cable, as shown in FIG. 8 of the patent. Such a system typically uses 18 to 24 inches of coaxial cable. All cables used for a test set up must be of the same length to maintain signal integrity. It would be desirable, especially for ever higher speed applications, to have a more compact contact assembly available and one with improved flexibility and independence for providing particular characteristics of the several contacts of the assembly.

SUMMARY OF THE INVENTION

It is an object of the present invention to provide a double-ended contact assembly particularly useful for high frequency signal testing which is more compact than prior art devices yet one which provides improved impedance matching. Another object of the invention is the provision of a double ended coaxial contact assembly which is more conducive to adaptation to various customer requirements including independent choice of contact tip styles and spring forces for the ground plungers as well as the center probes.

Briefly, in accordance with the invention, a center probe rod is lockingly received in a generally cylindrical center dielectric spacer bushing. Each end of the center probe rod is formed with a bias surface inclined relative to the longitudinal axis of the center probe rod for engagement with a biasing ball of a respective center probe assembly received at each end of the center probe rod. The center spacer bushing and center probe rod subassembly is received in a ground shield sleeve with the longitudinal axial position of the subassembly suitably fixed relative to the ground sleeve as by detents formed in the ground sleeve in alignment with an annular groove formed in the outer periphery of the center spacer bushing.

Selected ground contact tip configurations are formed at opposite ends of the ground sleeve. Each end of the center probe rod is telescopically received for limited relative sliding movement in one end of a respective center probe barrel mounting a center probe contact having a selected contact tip configuration at the other end. A biasing spring is disposed in each center probe barrel between the center probe contact and the biasing ball to bias the center probe barrel outwardly limited by detents of the center probe barrel received in a reduced diameter portion of the center probe rod. The center probe barrel is also received in a respective dielectric outer spacer bushing to maintain coaxial relationship with the ground sleeve. In one embodiment the center probe rod is formed with an axially extending bore in which posts extending from the center probe contacts are slidingly received in opposite ends of the bore and with the center probe barrels biased outwardly by a respective coil spring received on the center probe rod between the center spacer bushing and the respective center probe barrel.

In other embodiments, the ground sleeve is provided with a tubular ground plunger contact slidingly received in each end of the ground sleeve and separate coil springs are disposed between each ground plunger contact and the center spacer bushing for biasing the ground plunger contacts outwardly. In one preferred embodiment, the center spacer bushing is provided with a sleeve which preferably extends axially to a position where the inboard end of the ground plunger contact overlaps the distal free end of the sleeve when the ground plunger contacts are in the depressed or actuated position. In yet another preferred embodiment, one end of the double-ended contact assembly is formed with an MMCX type coaxial connector plug.

Contact assemblies made in accordance with the invention are shorter in length than prior art devices, e.g., less than 1 inch in length, which allows for a more compact system. Each end of the assembly operates independently of the other end and is common only by the center probe rod and center spacer bushing subassembly fastened to the ground sleeve. This allows for the same center probe rod and center spacer bushing subassembly to be used with different tip styles and spring forces. Also, when used with movable ground plungers, different spring forces can be used on the two ends of the contact assembly.

BRIEF DESCRIPTION OF THE DRAWINGS

The accompanying drawings, which are incorporated in and constitute a part of the specification, illustrate preferred embodiments of the invention and, together with the description, serve to explain the objects, advantages and principles of the invention. In the drawings, FIG. 1 is a cross sectional view of a shielded double ended coaxial contact assembly made in accordance with a first preferred embodiment of the invention, shown in the unactuated position;

FIG. 2 is a view of the FIG. 1 assembly, partly in cross section, shown in an actuated position;

FIG. 7 is a cross sectional view of a modification of the FIG. 5 assembly mounted in a typical mounting board and shown in the unactuated position;

FIG. 8 is a front elevational view of the FIG. 7 assembly, partly in cross section, rotated 45 degrees for the purpose of illustration and shown without the mounting board.

DETAILED DESCRIPTION OF THE PREFERRED EMBODIMENT

Figure 3:
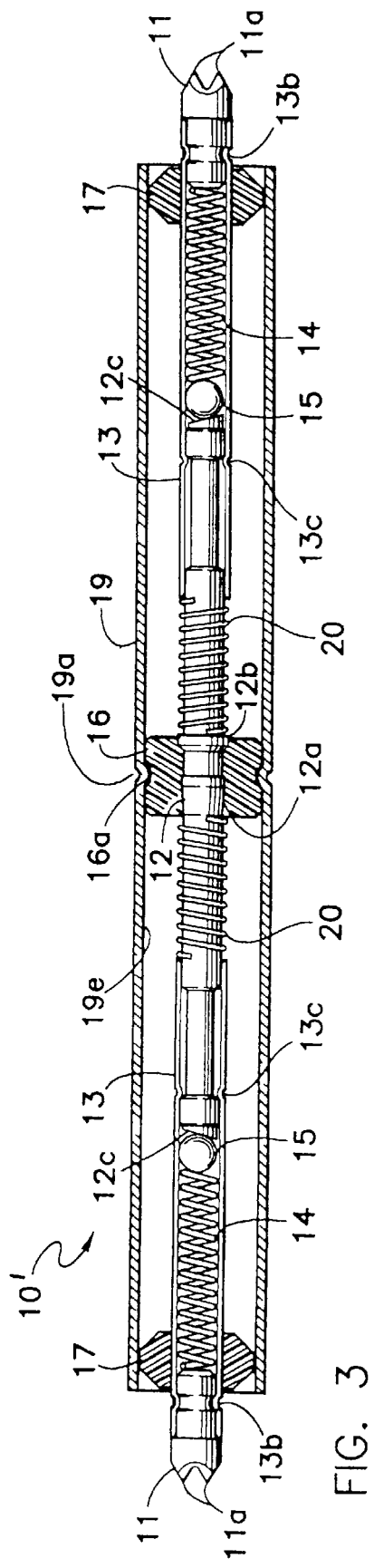
FIG. 3 is a cross sectional view of a modification of the FIGS. 1,2 assembly shown in the unactuated position.

With reference to FIGS. 1,2, a shielded double ended coaxial contact assembly 10 is shown comprising, at each end of the assembly, a generally cylindrical signal or center probe contact 11 preferably having center probe contact tips 11a of a selected type and having a reduced diameter portion which is received in a center probe barrel 13 essentially forming a common outside diameter therewith. Probe barrel 13, of suitable electrically conductive material such as a copper alloy, preferably is provided with a precious metal internal contact surface 13a. Probe contact 11 is fixedly attached to center probe barrel 13 by suitable means such as a press fit or, as shown, detents 13b received in an annular groove formed in center probe contact 11.

A center probe rod 12 is preferably formed with a feature for retention in a center spacer bushing formed of dielectric material, to be described, such as a frusto-conical portion 12 along with a location feature such as a flange 12b. The center probe rod can be conveniently formed in two parts, one part having an end press fit into a bore formed in an end of the other part. Center probe rod 12 has opposite distal free ends formed with a bias surface 12c which forms an inclined angle with the longitudinal axis of the center probe rod. Each distal end of the center probe rod is received in one end of a respective center probe barrel 13 and retained therein for sliding movement by center probe barrel dentents 13c received in a reduced diameter portion of center probe rod 12. The bias surface 12c of the center probe rod distal end abuts ball 15 at one end of a coil spring 14 between ball 15 and center probe contact 11. The opposite end portion of probe barrel 13 is fixedly mounted in outer spacer 17 which is slidingly received in a ground sleeve 19 formed of conductive material preferably having a precious metal inner layer 19e.

Center spacer bushing 16 and outer spacer bushings 17 are formed of suitable dielectric material, such as polytetrafluoroethylene, and serve to maintain a coaxial relationship between the center probe conductors and ground sleeve 19. Center spacer bushing 16 is formed with an annular groove 16a which serves to maintain the spacer bushing and center probe rod subassembly in a selected position relative to ground sleeve 19 by means of detents 19a in the ground sleeve which are received in the annular groove.

Contact assembly 10 is particularly suited for use in a high speed signal application. The outside diameter of the signal or probe components relative to the inside diameter of the ground sleeve is matched to create a selected characteristic impedance depending on the system with which the contact assembly will be used. Among the limitations of the prior art, spring loaded contact devices are subject to undesirable impedance mismatches along the axial length of the devices. In accordance with the invention, such mismatches are minimized. Areas of dielectric mismatches vary depending upon the dielectric material and distance between the outer face of the center probe conductors and inner face of the ground sleeve. In the FIGS. 1,2 assembly, the dielectric and distance are matched essentially throughout the entire length with the exception of the exposed portion of biasing rod 12 (see FIG. 2 which shows the assembly in the actuated position). The diameter of the center probe rod is reduced where it passes through the center spacer to compensate for the higher dielectric characteristic of center spacer bushing 16 and provides impedance matching relative to the difference between the dielectric constant of air, which is the primary dielectric of the assembly, and the dielectric constant of the insulating material used to separate the center probe conductor from the ground conductor of the coaxial contact assembly.

FIG. 3 shows a modified shielded coaxial contact assembly 10'. The FIG. 3 assembly is similar to that shown in FIGS. 1,2 but further comprises a coil spring 20 received on each side of center probe rod 12 between center probe barrels 13 and center spacer bushing 16 with the outside diameter of spring 20 closely matching that of center signal barrel 13. At certain higher frequencies the spring resembles a solid cylinder with regard to its affect on signal propagation thereby providing improved impedance matching.

Figure 4:
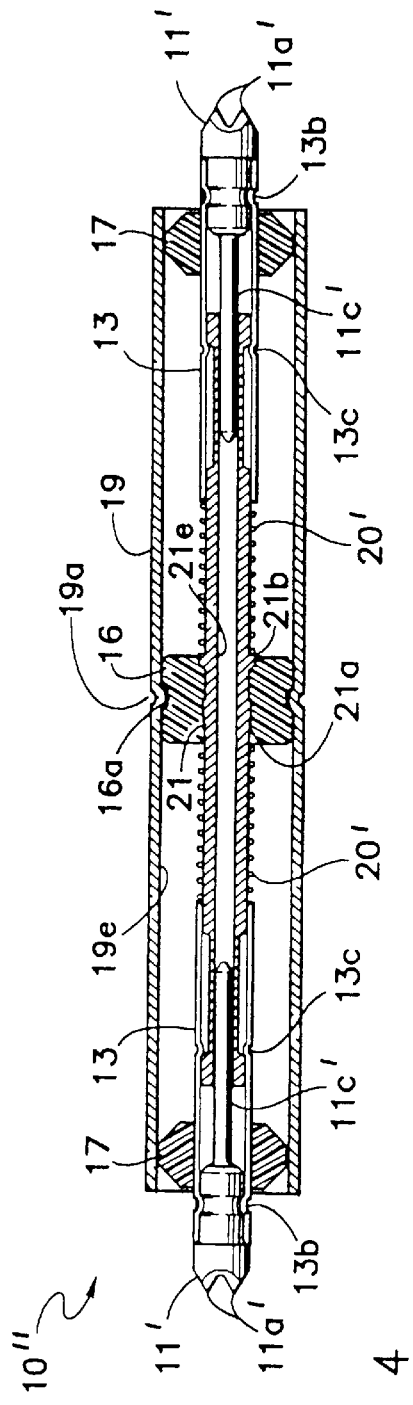
FIG. 4 is a cross sectional view of another modification of the FIGS. 1,2 assembly, shown in the unactuated position.

FIG. 4 shows a modified shielded coaxial assembly 10" in which spring 20' performs the functions of both springs 20 and 14 of the FIG. 3 embodiment. Center probe rod 21 is provided with a longitudinal axially extending bore 21e, preferably having a precious metal layer thereon. Probe contact 11' is provided with posts 11c' which are slidingly received in respective bores of the center probe rod providing redundant contacts. The FIG. 4 embodiment provides a structure in which the overall length of the coaxial contact assembly can be considerably shortened which is of particular advantage in high frequency applications.

Figure 5:
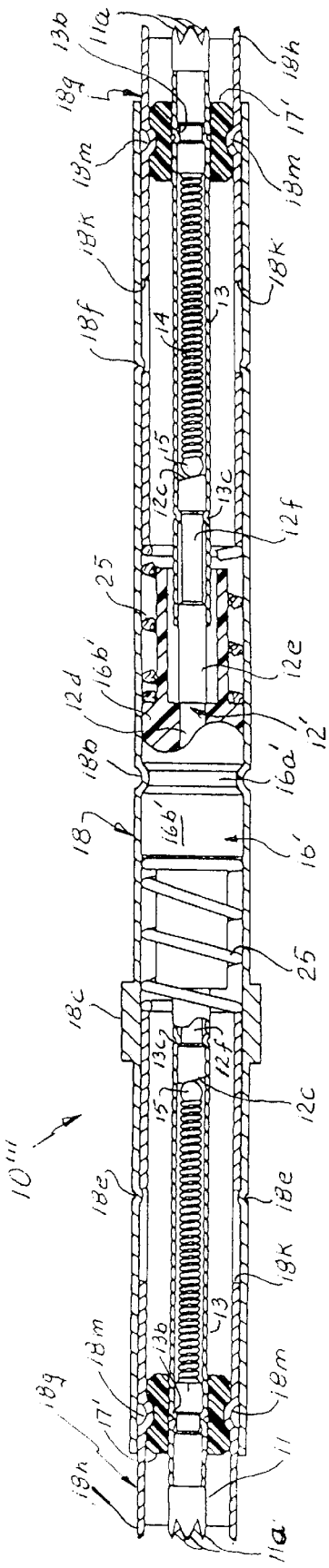
FIG. 5 is a cross sectional view of a shielded contact assembly of the type shown in FIGS. 1,2 modified to include movable ground plungers, shown in the unactuated position.
Figure 6:
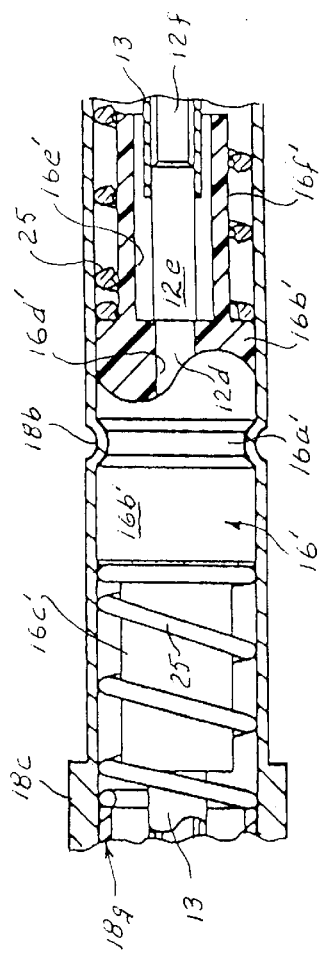
FIG. 6 is an enlarged broken away portion of FIG. 5.

FIGS. 5,6 show a contact assembly 10''' which has center probe contacts similar to that of FIGS. 1,2 but is modified to incorporate movable ground plungers. Contact assembly 10''' comprises a center spacer bushing 16' formed with a groove 16a' extending around the circumference of the spacer bushing at the center thereof similar to groove 16a shown in FIGS. 1,2, however, body 16b' is extended further along the longitudinal axis than in center spacer bushing 16 of the earlier embodiment to enhance the stability of the assembly. Center spacer bushing 16' is formed of suitable material, such as Teflon, with a longitudinally extending, central bore 16d' which receives central section 12d of center probe rod 12'. Central section 12d is formed with a diameter closely matching that of central bore 16d' but smaller than that of adjacent rod portions 12e. The characteristics of the Teflon material allow rod portion 12e to be forced through the bore so that central portion 12d of the rod can snap into place. This arrangement not only provides a rigid support for center probe rod 12' but also the smaller diameter of central portion 12d serves to evenly compensate for the higher dielectric characteristic of center spacer bushing 16' all along the axial length of the center spacer bushing.

A center probe barrel 13 of the type shown in FIGS. 1,2 is slidingly received on each end of center probe rod 12' with detents 13c in the center probe barrel received in a reduced diameter section 12f of center probe rod 12' to limit outward motion of the respective center probe barrel. A coil spring 14 is received between inclined bias surface 12c formed at each distal end of center probe rod 12' and the respective center probe contact 11. Center probe contacts 11 are formed with selected contact tip configurations 11a and have an outer diameter at the distal end thereof which match that of center probe barrels 13. Center probe contacts 11 are suitably fixed in respective center probe barrels 13 as by use of detents 13b received in a reduced diameter portion of center probe rod 12'.

Center spacer bushing 16', center probe rod 12' and the center probe assemblies are received in an open ended ground shield sleeve 18 with the axial position of center spacer bushing 16' fixed by suitable means such as detents 18b in sleeve 18 received in circumferentially extending groove 16a' of center spacer bushing 16'. A tubular ground plunger 18g is slidably received in each open end of ground shield sleeve 18. Suitable means, such as detents 18f formed in the ground shield sleeve and extending into axially extending slots 18k in ground plunger 18g limit motion of the ground plunger between selected limits. Each center probe barrel 13 is slidingly received in the bore of outer dielectric spacer bushing 17'. Outer spacer bushings 17' are provided with a circumferentially extending groove and detents 18m are formed in ground plungers 18g and received in the grooves for fixing the axial position of outer spacer bushings 17'.

An integrally formed dielectric sleeve 16c' extends in the longitudinal axial direction from both ends of body portion 16b' and is provided with an internal bore 16e to provide clearance for center probe rod 12' and center probe barrels 13 and an outside diameter 16f less than that of body portion 16b' to receive ground plunger coil springs 25 thereon which extend from body portion 16b' to the inboard end of the respective ground plunger. Preferably, the distal free ends of sleeve 16c' extend beyond the location of springs 25 when the ground plungers are depressed normally, i.e., in the actuated position, with the inboard ends of the ground plungers overlapping at least a portion of the sleeves. Sleeves 16c' serve to smoothen out the electrical signal. The outboard ends of ground plungers 18g are formed with selected contact tip configurations 18h.

FIGS. 7,8 show a modified shielded coaxial assembly 10''' having movable ground plungers 22 slidably mounted in a stationary ground shield sleeve 24. Tubular ground plungers 22 are biased outwardly by ground plunger coil springs 25. Outward movement can be limited by any conventional mechanism such as retention plugs 23 press fit into respective holes 22f in ground plungers 22. Each retention plug 23 is slidingly received in a slot 24c in ground sleeve 24 which positions and retains ground plungers 22. As best seen in FIG. 8, slots 24c extend in a straight line in a direction generally parallel to the longitudinal axis of the ground sleeve however it is within the purview of the invention to form the slots at an angle to the longitudinal axis which would cause the ground sleeve contacts to rotate upon movement thereof. Outer spacer bushings 17" are modified to have tapered end face walls leading to a shortened axially extending bore. This mitigates frictional resistance for sliding movement of the spacers on center probe barrels 13. The assembly made in accordance with this embodiment is shown received in a mounting board 6 and locked in a selected axial location utilizing flange 24b of ground sleeve 24.

Figure 9:
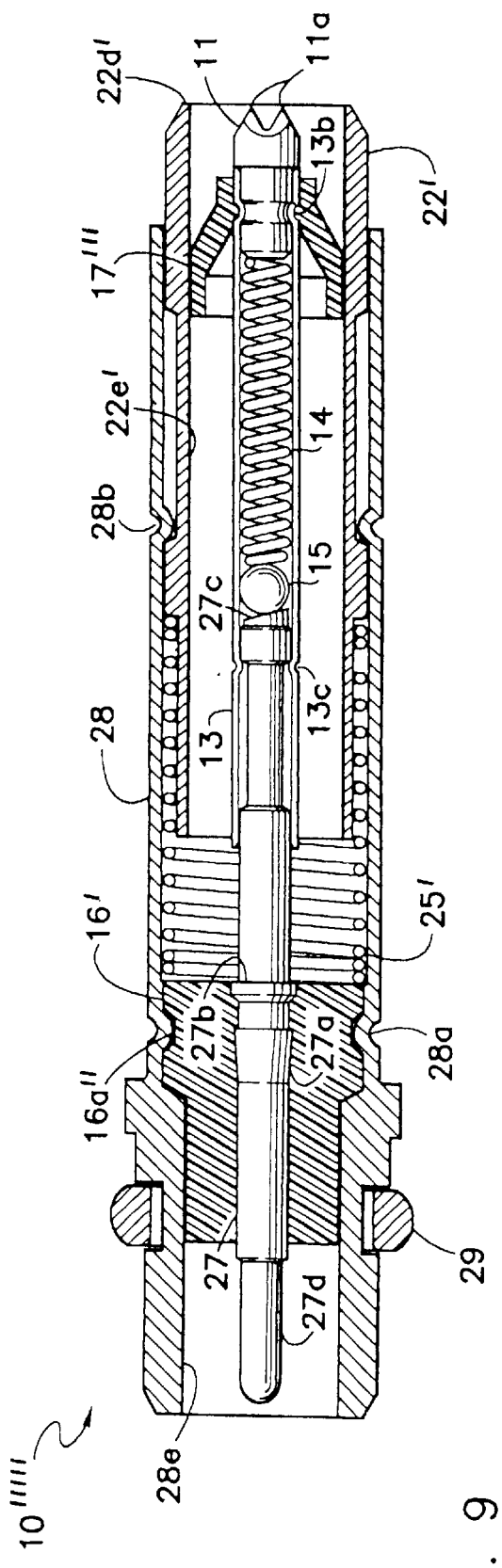
FIG. 9 is a cross sectional view of a single ended contact made in accordance with the invention to use as a test jack.

FIG. 9 shows a single ended contact assembly 10'''' with one end of the center probe rod 27 adapted to mate with a standard MMCX type coaxial connector plug. The single ended contact assembly has a spacer bushing 16" formed of suitable dielectric material, such as the material of bushings 16 and 16' of the previously described embodiments. Frusto-conical portion 27a and flange 27b correspond to portions 12a, 12b of the FIGS. 1,2 embodiment. Signal post jack 27d is formed with a diameter selected to fit an MMCX type connector. Center probe contact 11 and center probe barrel 13 are as shown in the FIGS. 1,2 embodiment, however, a modified dielectric spacer bushing for center probe barrel 13 is shown. Spacer bushing 17''', formed of suitable dielectric material such as the same as used for spacer bushing 16, 16' described above, is formed with a frusto-conical central web portion between larger and smaller ring portions to provide improved impedance matching. It will be understood that this structure can also be used in place of spacers 17, 17', 17" in the above described embodiments, if desired. As shown in FIG. 9, spacer 17''' interfits with detents 13b to fixedly attach the spacer bushing to the probe barrel. Ground plunger 22' is received in the bore of ground shield sleeve 28 and is biased outwardly by ground plunger spring 25' with its outward motion limited by detents 28b formed in ground shield sleeve 28 interfacing with an outwardly extending flange on ground plunger 22'. As in the previous multipart ground embodiments, the ground shield sleeve is provided with a precious metal lining 28e'. Interface spring 29 received in an annular groove formed in the outer periphery of ground shield sleeve 28 allows the coaxial contact to mate and be retained by a standard MMCX connector plug.

Although the invention has been described with regard to certain preferred embodiments thereof, variations and modifications will become apparent to those skilled in the art. It is, therefore, the intention that the appended claims be interpreted as broadly as possible in view of the prior art to include all such variations and modifications.

What is claimed is:

1. An electrical double ended, coaxial contact assembly comprising:

a cylindrical electrically conductive relatively non-flexible center probe rod having a longitudinal axis and having a central portion and two opposite end portions, a probe contact assembly slidably mounted on each end portion of the center probe rod, each probe contact assembly comprising a center probe barrel having an inboard end portion and an outboard end portion, the inboard end slidably mounted on an end portion of the center probe rod, a center probe contact tip disposed at the outboard end of the center probe barrel and a coil spring disposed in the center probe barrel between the center probe rod and the center probe contact tip urging the center probe barrel away from the center probe rod in a direction along the longitudinal axis, a dielectric center spacer bushing having a centrally disposed, longitudinally extending bore therethough, the central portion of the center probe rod received in the bore, and an open ended electrically conductive ground sleeve, the center spacer bushing and the center probe rod and probe contact assemblies received in the ground sleeve with the position of the center spacer bushing fixed relative to the ground sleeve.

2. An electrical double ended, coaxial contact assembly according to claim 1 further comprising, for each probe contact assembly, an outer dielectric spacer bushing having a centrally disposed, longitudinally extending bore therethrough, the outboard end portion of the respective center probe barrel received in the bore of an outer spacer bushing, the outer spacer bushings being fixed to one of the respective center probe barrel and ground sleeve and being slidable relative to the other of the respective center probe barrel and ground sleeve.

3. An electrical, double ended, coaxial contact assembly according to claim 1 further comprising a tubular ground plunger slidably received in each open end of the ground sleeve between an outer unactuated position and an inner actuated position and a ground plunger coil spring disposed between each ground plunger and the center spacer bushing to urge the ground plungers in a direction out of the ground sleeve.

4. An electrical, double ended, coaxial contact assembly according to claim 3 further comprising, for each probe contact assembly, an outer dielectric spacer bushing having a centrally disposed, longitudinally extending bore therethrough, the outboard end portion of the respective center probe barrel received in the bore of the outer spacer bushing, the outer spacer bushing being fixed to one of the respective center probe barrel and respective ground plunger and being slidable relative to the other of the respective center probe barrel and respective ground plunger.

5. An electrical, double ended, coaxial contact assembly according to claim 1 in which the central portion of the center probe rod is formed with a uniform reduced diameter along an axial length essentially equal to the length of the bore of the center spacer bushing relative to adjacent rod portions and the diameter of the bore of the center spacer bushing is selected to closely match the diameter of the central portion of the center rod probe thereby enhancing impedance matching.

6. An electrical, double ended, coaxial assembly comprising:
- a cylindrical electrically conductive center probe rod having a longitudinal axis and having a central portion and opposite end portions,
- a probe contact assembly slidably mounted on each end portion of the center probe rod, each probe contact assembly comprising a center probe barrel having an inboard end portion and an outboard end portion, the inboard end slidably mounted on an end portion of the center probe rod, a center probe contact tip disposed at the outboard end of the center probe barrel and a coil spring disposed in the center probe barrel between the center probe rod and the center probe contact tip urging the center probe barrel away from the center probe rod in a direction along the longitudinal axis,
- a dielectric center spacer bushing having a centrally disposed, longitudinally extending bore therethough, the central portion of the center probe rod received in the bore,
- an open ended electrically conductive ground sleeve, the center spacer bushing and the center probe rod and probe contact assemblies received in the ground sleeve with the position of the center spacer bushing fixed relative to the ground sleeve,
- a tubular ground plunger slidably received in each open end of the ground sleeve between an outer unactuated position and an inner actuated position and a ground plunger coil spring disposed between each ground plunger and the center spacer bushing to urge the ground plungers in a direction out of the ground sleeve,
- the center spacer bushing has a body with opposite end face portions and a dielectric sleeve is integrally formed with the center spacer bushing and extends away from the body in a direction along the longitudinal axis from each face portion, and a respective ground plunger spring is received over the dielectric sleeve.

7. An electrical, double ended, coaxial contact assembly according to claim 6 in which each ground plunger overlaps a respective center spacer bushing dielectric sleeve when the ground plungers are moved to the actuated position.

8. An electrical, double ended, coaxial contact assembly according to claim 1 in which each end portion of the center probe rod has an end surface which is inclined relative to the longitudinal axis of the center probe rod to serve as a biasing surface.

9. An electrical, double ended, coaxial contact assembly according to claim 7 in which the central portion of the central probe rod is formed with a reduced diameter relative to adjacent portions of the center probe rod and the diameter of the bore of the center spacer bushing is selected to closely match the diameter of the central portion of the center probe rod.

10. An electrical double ended, coaxial contact assembly comprising:
- a cylindrical electrically conductive center probe rod having a longitudinal axis and having a central portion and opposite end portions,
- a probe contact assembly slidably mounted at each end portion of the center probe rod,
- a dielectric center spacer bushing having a centrally disposed, longitudinally extending bore therethough, the central portion of the center probe rod received in the bore,
- an open ended electrically conductive ground sleeve, the center spacer bushing and the center probe rod and probe contact assemblies received in the ground sleeve with the position of the center spacer bushing fixed relative to the ground sleeve,
- a tubular ground plunger slidably received in each open end of the ground sleeve between an outer unactuated position and an inner actuated position and a ground plunger coil spring disposed between each ground plunger and the center spacer bushing to urge the ground plungers in a direction out of the ground sleeve,
- the center spacer bushing having a body with opposite end face portions, a dielectric sleeve integrally formed with the center spacer bushing and extending away from the body in a direction along the longitudinal axis from each face portion, and a respective ground plunger spring received over the dielectric sleeve.

11. An electrical, double ended, coaxial contact assembly according to claim 10 in which each ground plunger overlaps a respective center spacer bushing dielectric sleeve when the ground plungers are moved to the actuated position.

12. An electrical, double ended, coaxial contact assembly according to claim 11 in which the central portion of the central probe rod is formed with a reduced diameter relative to adjacent portions of the center probe rod and the diameter of the bore of the center spacer bushing is selected to closely match the diameter of the central portion of the center probe rod.

* * * * *